(12) United States Patent
Li et al.

(10) Patent No.: US 11,217,595 B2
(45) Date of Patent: Jan. 4, 2022

(54) ANTIFUSE OTP STRUCTURE WITH HYBRID DEVICE AND HYBRID JUNCTION FOR SELECT TRANSISTOR

(71) Applicant: Zhuhai Chuangfeixin Technology Co., Ltd., Zhuhai (CN)

(72) Inventors: Li Li, Femont, CA (US); Zhigang Wang, Fremont, CA (US)

(73) Assignee: Zhuhai Chuangfeixin Technology Co., Ltd., Zhuhai (CN)

( * ) Notice: Subject to any disclaimer, the term of this patent is extended or adjusted under 35 U.S.C. 154(b) by 170 days.

(21) Appl. No.: 16/744,060

(22) Filed: Jan. 15, 2020

(65) Prior Publication Data

US 2021/0217756 A1 Jul. 15, 2021

(51) Int. Cl.
  *H01L 27/112* (2006.01)
(52) U.S. Cl.
  CPC .............................. *H01L 27/11206* (2013.01)
(58) Field of Classification Search
  CPC ........... H01L 27/11206; H01L 23/5252; H01L 2924/1453; G11C 17/14; G11C 17/16; G11C 17/165
  See application file for complete search history.

(56) References Cited

U.S. PATENT DOCUMENTS

| | | | |
|---|---|---|---|
| 6,667,902 B2 | 12/2003 | Peng | |
| 6,671,040 B2 | 12/2003 | Fong | |
| 6,798,693 B2 | 9/2004 | Peng | |
| 6,822,888 B2 | 11/2004 | Peng | |
| 7,277,347 B2 * | 10/2007 | Jenne | G11C 17/16 365/202 |
| 7,402,855 B2 | 7/2008 | Kurjanowiez | |
| 8,283,751 B2 | 10/2012 | Kurjanowicz | |
| 8,681,528 B2 * | 3/2014 | Wu | H01L 27/11206 365/104 |
| 9,281,074 B2 * | 3/2016 | Wu | G11C 17/16 |
| 10,090,309 B1 * | 10/2018 | Chen | G11C 7/22 |
| 11,018,143 B1 * | 5/2021 | Li | H01L 21/266 |
| 2021/0143161 A1 * | 5/2021 | Li | H01L 27/11206 |
| 2021/0249425 A1 * | 8/2021 | Li | H01L 27/11246 |

FOREIGN PATENT DOCUMENTS

| | | | |
|---|---|---|---|
| CN | 104681558 A | * | 6/2015 |
| CN | 104681558 A | | 6/2015 |

* cited by examiner

*Primary Examiner* — Allison Bernstein
(74) *Attorney, Agent, or Firm* — SV Patent Service (57) ABSTRACT

An antifuse One-Time-Programmable memory cell includes a substrate, a select transistor formed on the substrate, and an antifuse capacitor formed on the substrate. The select transistor includes a first gate dielectric layer formed on the substrate, a first gate formed on the gate dielectric layer, a first low-voltage junction formed in the substrate, and a second low-voltage junction formed in the substrate. A source and a drain for the select transistor are formed by the first low-voltage junction and the second low-voltage junction. The antifuse capacitor includes a second gate dielectric layer formed on the substrate, a second gate formed on the gate dielectric layer, a third low-voltage junction formed in the substrate, and a fourth low-voltage junction formed in the substrate. A source and a drain for the antifuse capacitor are respectively formed by the third low-voltage junction and the fourth low-voltage junction.

5 Claims, 7 Drawing Sheets

ANTIFUSE OTP STRUCTURE WITH HYBRID DEVICE AND HYBRID JUNCTION FOR SELECT TRANSISTOR

BACKGROUND OF THE INVENTION

The present invention relates to the technical field of semiconductor memory, and in particular, to One Time Programmable (OTP) memory.

Embedded Non-Volatile Memory (ENVM) technology has been employed in a number of applications such as post silicon tuning, memory repair, on-line field test, and secure ID storage. ENVM is also a critical component for self-healing applications in which information regarding time dependent failure mechanisms such as circuit aging must be retained during system power off periods. Anti-Fuse One Time Programmable (AF-OTP) NVM memory has been extensively used for memory repair in standard logic processes.

An antifuse is non-conductive in the native unprogrammed state and becomes conductive when programmed, hence the name antifuse. In integrated circuit, antifuse is commonly constructed with a thin dielectric layer sandwiched between two conductors. To program an antifuse, a high voltage is applied between the two conductors. This leads to a physical and permanent breakdown of the thin dielectric layer and the formation of a current conduction path between the two conductors. Antifuse can thus be used as a memory element. Programmed state of an antifuse represents data "1" and unprogrammed state "0" or vice versa. Once programmed, antifuse memory cannot revert to unprogrammed state, i.e., it is a one-time programmable (OTP) memory. Antifuse retains conductive or non-conductive state even after the power is turned off, rendering the data non-volatile. As such, antifuse memory is a non-volatile OTP memory.

In order to provide a high voltage to program the antifuse capacitor, the select transistor is usually built with high voltage junctions. However, transistor with high voltage junctions will take more silicon area because wider channel length and width are needed, and the more silicon area will directly correlate to higher cost. On the other hand, the antifuse capacitor is usually built with thinner gate dielectric for easier programming.

There is therefore a need for antifuse OTP memory cell with higher integration density.

SUMMARY OF THE INVENTION

In view of the above, the present disclosure provides an antifuse OTP memory bit cell that includes an antifuse capacitor and a metal-oxide-semiconductor field-effect-transistor (MOSFET). The MOSFET is a select transistor which is implemented to program or access the antifuse capacitor. A novel select transistor is provided, which includes a high voltage gate dielectric layer and a low voltage junction, for both high voltage programming and smaller silicon area.

In one general aspect, the present invention relates to an antifuse One-Time-Programmable memory cell, which includes: a substrate; a select transistor formed on the substrate, wherein the select transistor includes: a first gate dielectric layer formed on the substrate, a first gate formed on the gate dielectric layer; a first low-voltage junction formed in the substrate; and a second low-voltage junction formed in the substrate, wherein a source and a drain for the select transistor are formed by the first low-voltage junction and the second low-voltage junction; and an antifuse capacitor formed on the substrate, wherein the antifuse capacitor includes: a second gate dielectric layer formed on the substrate, a second gate formed on the gate dielectric layer; a third low-voltage junction formed in the substrate; and a fourth low-voltage junction formed in the substrate, wherein a source and a drain for the antifuse capacitor are respectively formed by the third low-voltage junction and the fourth low-voltage junction.

Implementations of the system may include one or more of the following. The first low-voltage junction or the second low-voltage junction or the third low-voltage junction or the fourth low-voltage junction has a threshold junction breakdown voltage below 3.2 Volt. The first low-voltage junction or the second low-voltage junction or the third low-voltage junction or the fourth low-voltage junction can have a threshold junction breakdown voltage below 2.3 Volt. The second low-voltage junction and the third low-voltage junction can be electrically connected. At least one of the first low-voltage junction or the second low-voltage junction can include two doped regions having different doping levels. The first low-voltage junction can include a first doped region adjacent to the first gate dielectric layer at a lower doped level than a second doped region away from the first gate dielectric layer. The second low-voltage junction can include a first doped region adjacent to the second gate dielectric layer at a lower doped level than a second doped region away from the second gate dielectric layer. One of the two doped regions can have an electrically active concentration of dopant level in a range of $3 \times 10^{17} \sim 1 \times 10^{19}$ atoms/$cm^{-3}$, wherein another one of the two doped regions can have an electrically active concentration of dopant level above $2 \times 10^{19}$ atoms/$cm^{-3}$. At least one of the third low-voltage junction or the fourth low-voltage junction can include two doped regions having different doping levels. The third low-voltage junction can include a first doped region adjacent to the first gate dielectric layer at a lower doped level than a second doped region away from the first gate dielectric layer. The fourth low-voltage junction can include a first doped region adjacent to the second gate dielectric layer at a lower doped level than a second doped region away from the second gate dielectric layer. One of the two doped regions can have an electrically active concentration of dopant level in a range of $3 \times 10^{17} \sim 1 \times 10^{19}$ atoms/$cm^{-3}$, wherein another one of the two doped regions can have an electrically active concentration of dopant level above $2 \times 10^{19}$ atoms/$cm^{-3}$.

In another general aspect, the present invention relates to an antifuse One-Time-Programmable memory cell, which includes a substrate; a first select transistor formed on the substrate, wherein the first select transistor includes: a first gate dielectric layer formed on the substrate, a first gate formed on the gate dielectric layer; a first low-voltage junction formed in the substrate; and a second low-voltage junction formed in the substrate, wherein a source and a drain for the first select transistor are formed by the first low-voltage junction and the second low-voltage junction; an antifuse capacitor formed on the substrate, wherein the antifuse capacitor includes: a second gate dielectric layer formed on the substrate, a second gate formed on the gate dielectric layer; a third low-voltage junction formed in the substrate; and a fourth low-voltage junction formed in the substrate, wherein a source and a drain for the antifuse capacitor are respectively formed by the third low-voltage junction and the fourth low-voltage junction; and a second select transistor formed on the substrate, wherein the second select transistor includes: a third gate dielectric layer formed on the substrate, a third gate formed on the gate dielectric layer; a fifth low-voltage junction formed in the substrate; and a sixth low-voltage junction formed in the substrate, wherein a source and a drain for the second select transistor are formed by the fifth low-voltage junction and the sixth low-voltage junction.

Implementations of the system may include one or more of the following. The second low-voltage junction and the third low-voltage junction can be electrically connected. The first low-voltage junction and the fifth low-voltage junction can be electrically connected. The first low-voltage junction or the second low-voltage junction or the third low-voltage junction or the fourth low-voltage junction or the fifth low-voltage junction or the sixth low-voltage junction can have a threshold junction breakdown voltage below 3.2 Volt. The first low-voltage junction or the second low-voltage junction or the third low-voltage junction or the fourth low-voltage junction or the fifth low-voltage junction or the sixth low-voltage junction can have a threshold junction breakdown voltage below 2.3 Volt.

These and other aspects, their implementations and other features are described in detail in the drawings, the description and the claims.

BRIEF DESCRIPTION OF THE DRAWINGS

To illustrate the technical solutions of the present invention, the accompanying drawings briefly described embodiments need to be used in describing the embodiments. Obviously, the following drawings only describe examples of the present invention. For those skilled in the art, other drawings may also be obtained according to these drawings without any creative work.

DETAILED DESCRIPTION OF THE INVENTION

The technical solutions in the embodiments of the present invention are described with reference to the accompanying drawings in the embodiments of the present invention.

Figure 1A:
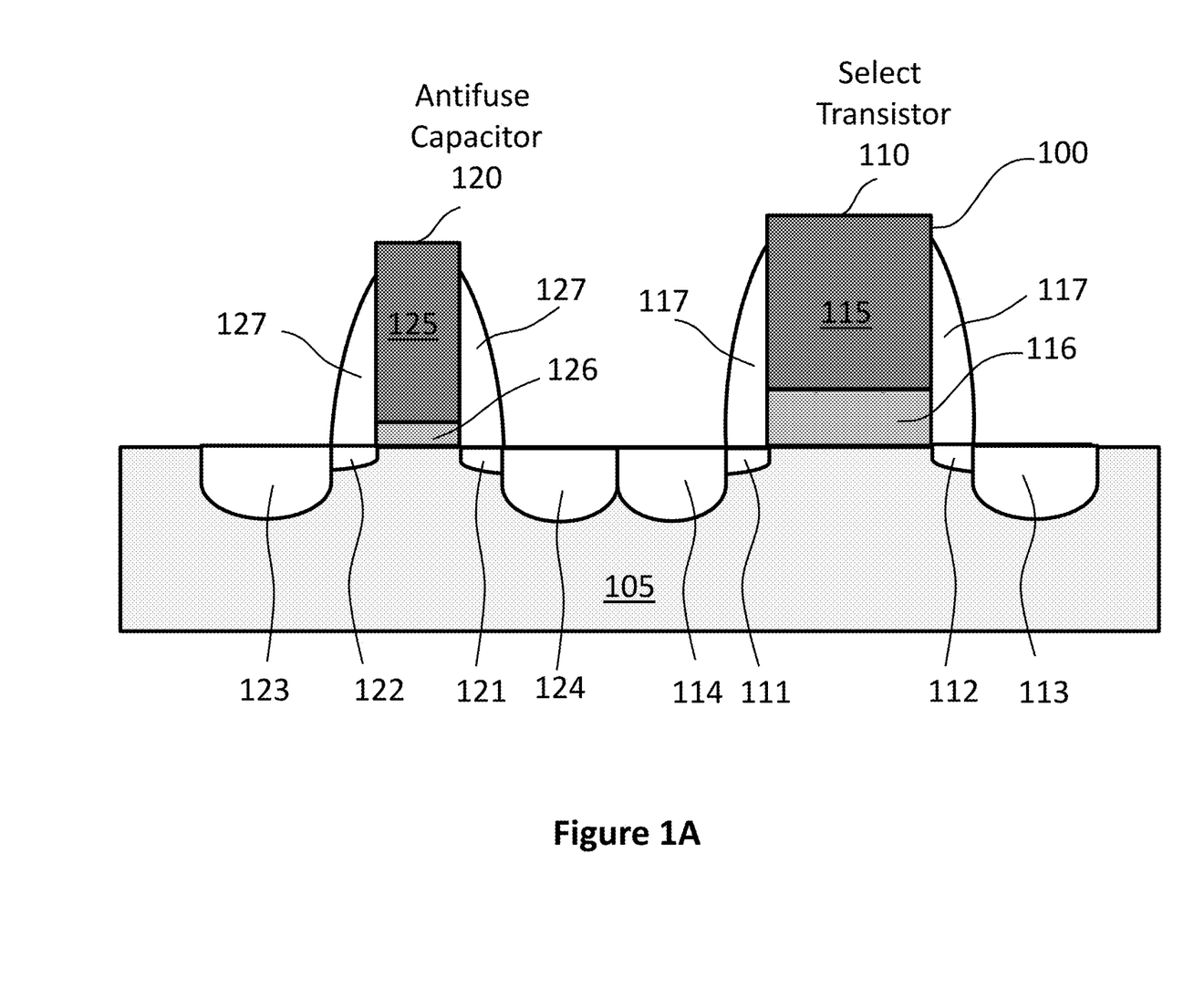
FIG. 1A is a cross-sectional view of a one-transistor one-capacitor (1T1C) antifuse OTP memory cell in accordance with some embodiments of the present invention.
Figure 1B:
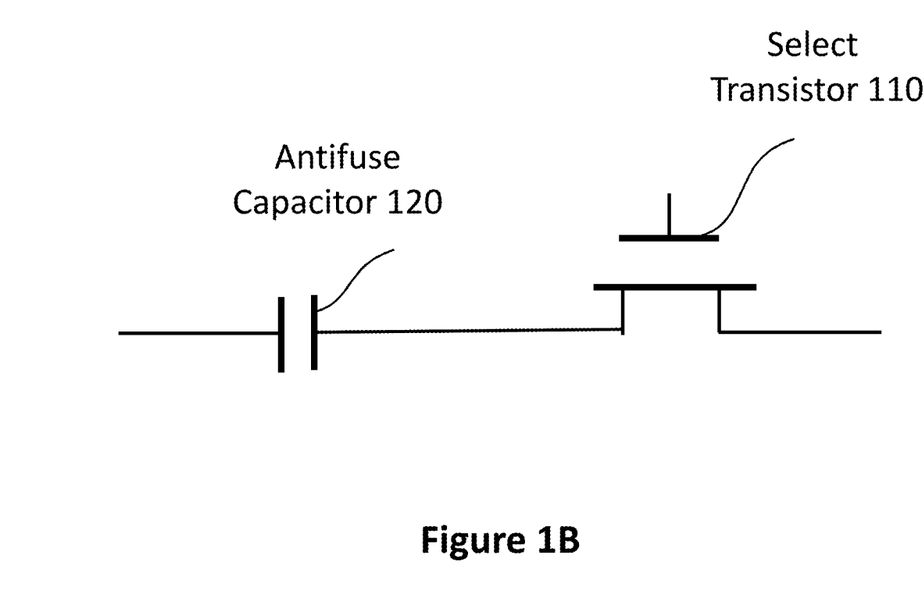
FIG. 1B is an equivalent circuit diagram of the one-transistor one-capacitor (1T1C) antifuse OTP memory cell shown in FIG. 1A.
Figure 1C:
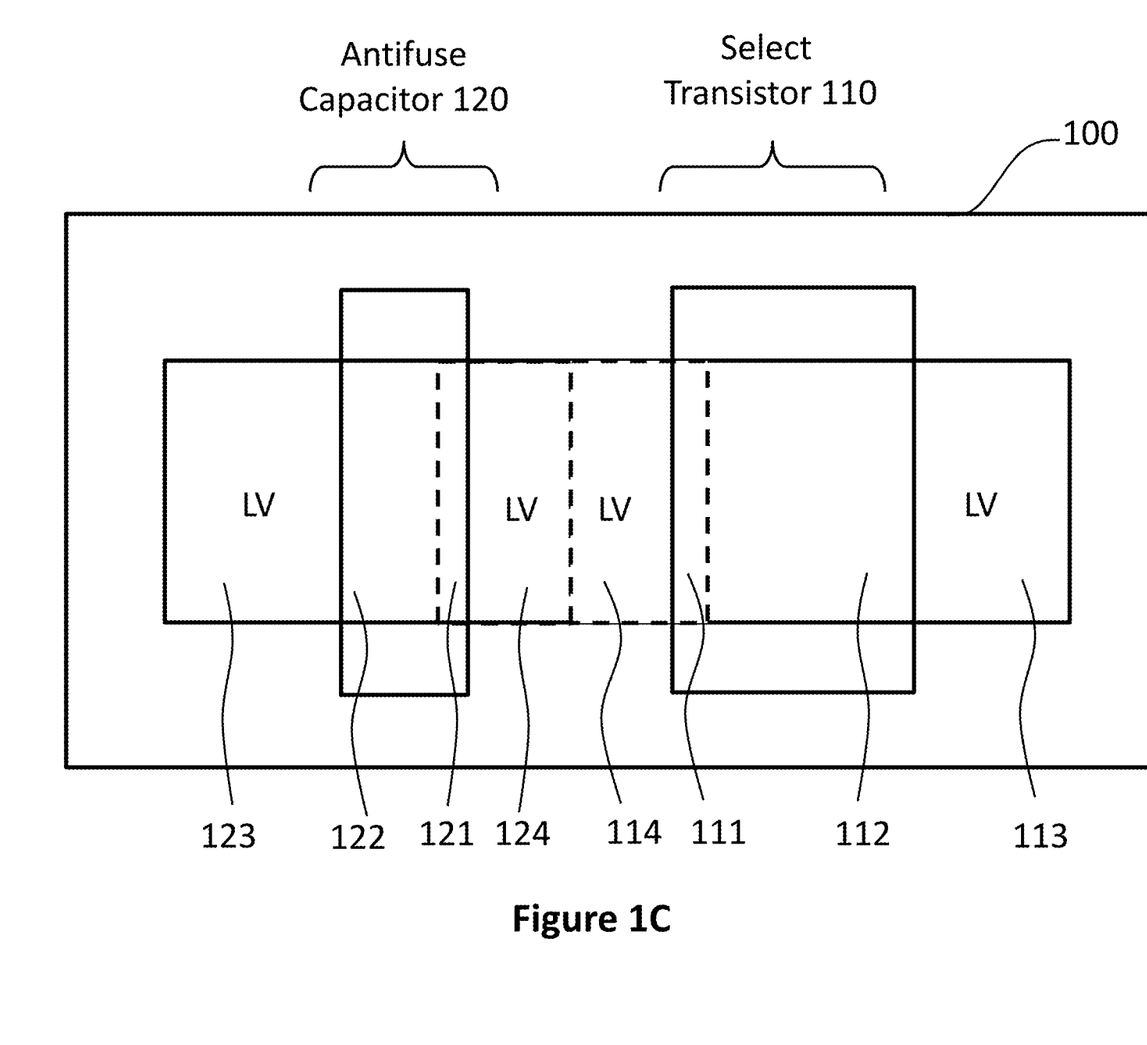
FIG. 1C is a schematic drawing of the one-transistor one-capacitor (1T1C) antifuse OTP memory cell shown in FIG. 1A.

In some embodiments, the antifuse OTP memory uses metal-oxide-semiconductor (MOS) capacitor as the antifuse element. The MOS capacitor is connected to an access device called select transistor, typically a metal-oxide-semiconductor field-effect-transistor (MOSFET) to form a one-transistor one-capacitor (1T1C) antifuse memory bit cell. Referring to FIGS. 1A-1C, a one-transistor one-capacitor (1T1C) antifuse OTP memory cell 100 includes a select transistor 110 and an antifuse capacitor 120. The select transistor 110 includes a gate 115 on a gate dielectric 116 on a substrate 105. The antifuse capacitor 120 includes a gate 125 on a gate dielectric 126 on the substrate 105. The junctions (e.g. the source or the drain) of the select transistor 110 are formed respectively by lightly doped regions 111, 112 and the deeply doped regions 113, 114. The junctions (e.g. source or drain) of the antifuse capacitor 120 are formed respectively by lightly doped regions 121, 122 and the deeply doped regions 123, 124.

The combination of lightly doped regions 111, 112 and 121, 122 and deeply doped regions 113, 114 and 123, 124 is formed as the source/drain regions on both sides of the channel by applying the spacer structures 117, 127 between two doping processes.

The source/drain and the gates 115, 125 of the select transistor 110 and the antifuse capacitor 120 are of the same conductivity type. The transistor channel region, i.e., the silicon substrate 105 underneath gate dielectric is of the opposite conductivity type. In the select transistor 110, for example, if the gate 115 and source/drain respectively formed by doped regions 111, 114 and doped regions 112, 113 are N type, the regions of the substrate 105 underneath the gate dielectric 116 is P type. Thus, the source/drain regions form PN junctions with the oppositely doped silicon substrate 105. Similarly, for the antifuse capacitor 120, if the gate 125 and source/drain respectively formed by doped regions 121, 124 and 122, 123 are N type, the region of the substrate 105 underneath the gate dielectric 126 is P type.

The doped regions 111, 112 and 121, 122 are lightly doped, wherein the electrically active concentration of dopant level can be in a range of $3\times10^{17}\sim1\times10^{19}$ atoms/cm$^{-3}$. The doped regions 113, 114 and 123, 124 formed on both sides of the channels are deeply doped, wherein the electrically active concentration of dopant level can be above $2\times10^{19}$ atoms/cm$^{-3}$.

Doped regions of 113, 112 are connected, and they are electrically conductive. Similarly, doped regions 111, 114, 124, and 121 are connected, and they are electrically conductive. Doped regions 122, 123 are also connected. During antifuse programming, a voltage is applied on the gate 115 to turn on the select transistor 110, i.e., to form a conductive channel in the substrate 105 underneath the gate dielectric 116. In the meantime, a programming voltage is applied to the doped region 113. Through the conductive path underneath the gate dielectric 116, the programming voltage is actually applied on the gate dielectric 126 to cause a dielectric breakdown. A low electrical resistance will be measured between the gate 125 and the doping region 124.

An important aspect of the present disclosure is that although the gate 115 and the gate dielectric 116 in the select transistor 110 support a high-voltage device, the doped regions 112 and 113 form a low-voltage (LV) junction with the substrate 105 for the select transistor 110. The combination of high voltage gate dielectric layer (i.e. an HV device) and a low voltage junction enables the select transistor to have both high-voltage programming and smaller footprint.

The junction breakdown threshold voltage for an LV junction can be lower than 3.2V, or below 2.3V depending on technology node of the device. Doped regions 112 and 113 form a LV junction with the substrate 105 for the select transistor 110. Doped regions 111 and 114 also form LV junction with the substrate 105 for the select transistor 110.

The gate 125 and the gate dielectric 126 in the antifuse capacitor 120 support a low-voltage device. The doped regions 111 and 114 also consistently form a low-voltage (LV) junction with the substrate 105 for the select transistor 110.

The junction breakdown threshold voltage for an LV junction can be lower than 3.2V, or below 2.3V depending on technology node of the device. Doped regions 121 and 124 form a LV junction with the substrate 105 for the antifuse capacitor 120. Doped regions 122 and 123 also form LV junction with the substrate 105 for the antifuse capacitor 120.

In order for high-voltage device and low-voltage junction select transistor to tolerance programming voltage stress, special designs can be implemented. For example, first turn on the select transistor connected to the antifuse capacitor that need to programmed, and then, apply programming voltage which is now actually applied on antifuse capacitor. The other non-selected memory cells are only applied with ½ of the programming voltage to avoid junction voltage breakdown.

The LV junction formed by doped regions 111, 114 for the select transistor 110 and the LV junction formed by doped regions 121, 124 for the antifuse capacitor 120 are conductively connected.

In order for transistor to function normally, the junction bias needs to be below junction breakdown voltage. For low voltage transistor, a shallower and steeper junction can be used without causing breakdown. Thus the device can have better short-channel behaviors. Formation of this kind of junction requires shallower implants, lower temperature and shorter anneals. For high-voltage transistor, it is critical to avoid a peak junction electric field that may cause breakdown; therefore the junction profile must be adjusted accordingly. To avoid introducing a very high peak field at the junction, more gradual junction doping profiles are preferred. This usually means deeper implants, longer (maybe multiple) annealing steps. This kind of junctions consequently can handle higher bias voltages.

Figure 1D:
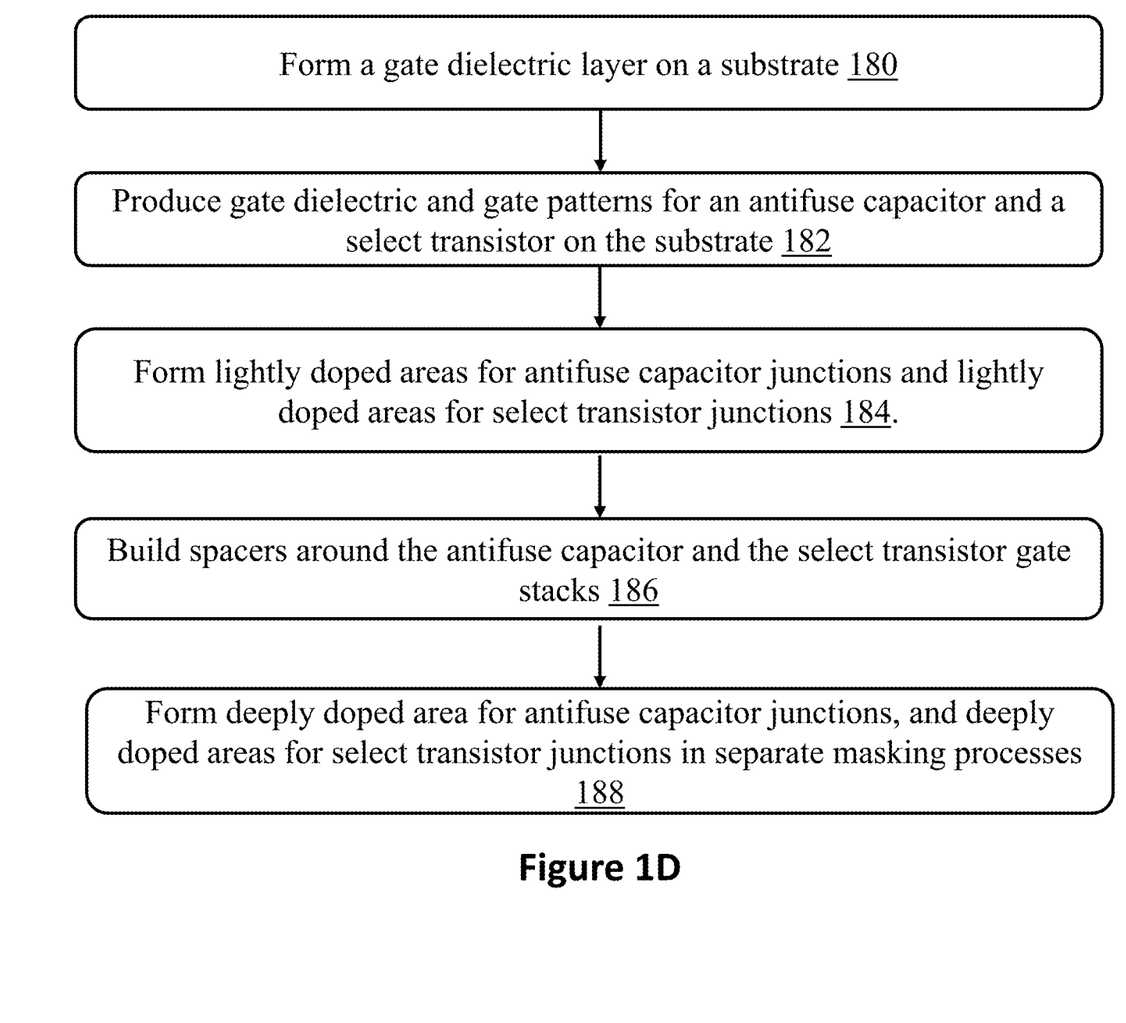
FIG. 1D is a process flow chart to build the one-transistor one-capacitor (1T1C) antifuse OTP memory cell shown in FIG. 1A.

Referring to FIG. 1D, a process to build the one-transistor one-capacitor (1T1C) antifuse OTP memory cell 100 can include the following steps. First, a gate dielectric layer is formed on a substrate (step 180). Gate dielectric and gate patterns are then produced for an antifuse capacitor and a select transistor on the substrate (step 182). These can be accomplished using masking and etching techniques. A thin gate dielectric layer is formed on the substrate for the antifuse capacitor and a thicker gate dielectric layer is formed on the substrate for the select transistor. Then, the gate stacks are formed on top of the gate dielectric layers respectively. The antifuse capacitor and the select transistor are defined by masking and etching. The combination of lightly doped regions and deeply doped regions is formed by applying the spacer structure 117, 127 between two doping processes.

The relatively shallow doping regions (e.g. 111, 121 in FIGS. 1A and 1B) for LV junction and the relatively shallow doping regions (e.g. 112, 122 in FIGS. 1A and 1B) for LV junctions are formed through a single masking and ion implants or separate masking and ion implants (step 184). As described above, annealing steps maybe added after dopant implant process, which can be tailored to form LV junctions with more tolerance to higher voltage.

Next, spacers are built around the antifuse capacitor stack and the select transistor gate stack (step 186). Deeply doped regions 113, 114 (FIGS. 1A and 1B) for the select transistor 110, and deeply doped regions 123, 124 (FIGS. 1A and 1B) for the antifuse capacitor 120 are formed in masking process and ion implant (step 188).

In steps 182-188, the source and drain junctions can be formed by ion implantation.

The above described only serves as examples of critical process steps to build a one-transistor one-capacitor (1T1C) antifuse OTP memory cell shown in FIGS. 1A-1C. Additional process steps maybe included between processes steps described above, and other process steps are needed before and after the processes steps described above for building an entire device.

An advantage of the above described one-transistor one-capacitor (1T1C) antifuse OTP memory cell 100 is that the high-voltage device in conjunction with a low-voltage junction in the select transistor 110 can enable channel length and channel width scaling and over-all 1T1C cell scaling.

Figure 2A:
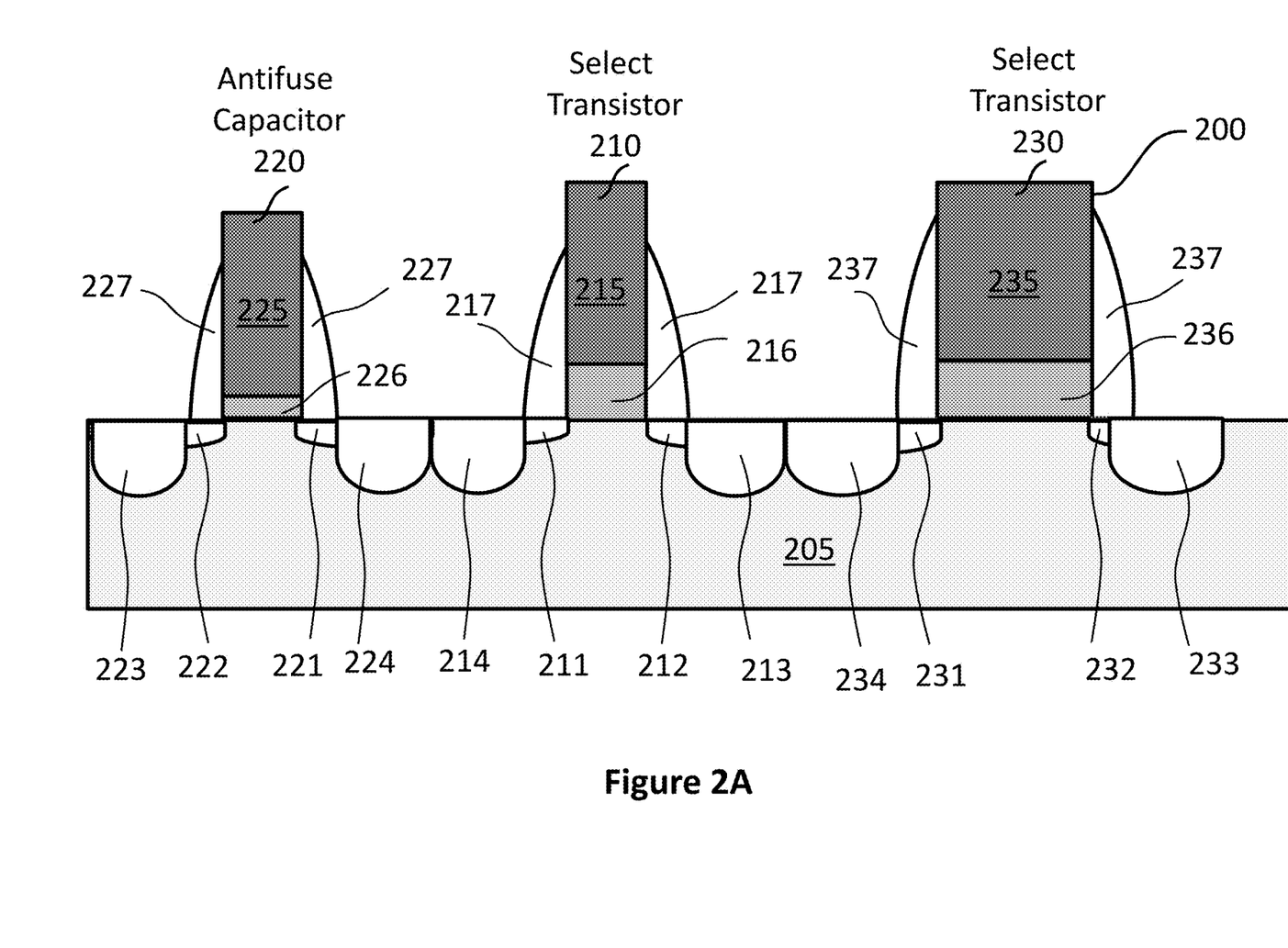
FIG. 2A is a cross-sectional view of a two-transistor one-capacitor (2T1C) antifuse OTP memory cell in accordance with some embodiments of the present invention.
Figure 2B:
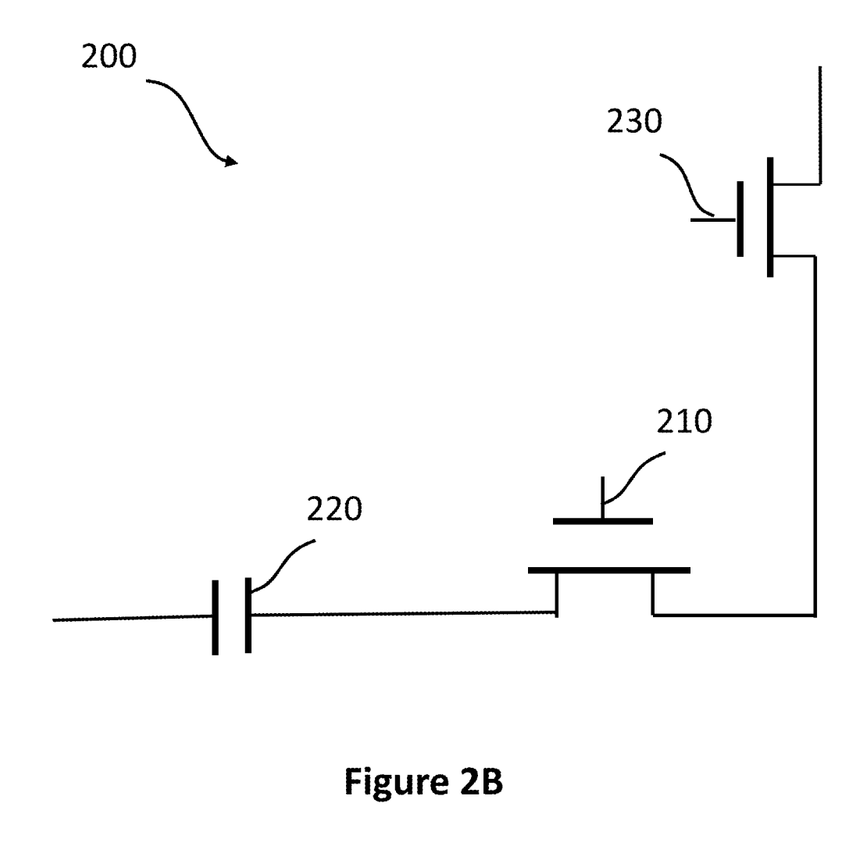
FIG. 2B is an equivalent circuit diagram of 2T1C antifuse OTP memory cell shown in FIG. 2A.

In some embodiments, referring to FIGS. 2A and 2B, a two-transistor one-capacitor (2T1C) antifuse OTP memory cell 200 includes a select transistor 210, an antifuse capacitor 220, and another select transistor 230. The select transistor 210 includes a gate 215 on a gate dielectric 216 on a substrate 205. The select transistor 230 includes a gate 235 on a gate dielectric 236 on a substrate 205. The antifuse capacitor 220 includes a gate 225 on a gate dielectric 226 on the substrate 205.

The junctions (e.g. the source or the drain) of the select transistor 210 are formed respectively by lightly doped regions 211, 212 and the deeply doped regions 213, 214. The junctions (e.g. the source or the drain) of the select transistor 230 are formed respectively by lightly doped regions 231, 232 and the deeply doped regions 233, 234. The junctions (e.g. source or drain) of the antifuse capacitor 220 are formed respectively by lightly doped regions 221, 222 and the deeply doped regions 223, 224.

The combination of lightly doped regions 211, 212, 221, 222, 231, 323 and deeply doped regions 213, 214, 223, 224, 233, 234 is formed as the source/drain regions on both sides of the channel by applying the spacer structures 217, 227, 237 between two doping processes. The doping properties, formations of PN junctions, and electric connections are similar to the description above in relation to the 1T1C memory cell.

Similar to the 1T1C antifuse OTP memory cell 100 described above, the gate 215 and the gate dielectric 216 in the select transistor 210 form a high-voltage device, the doped regions 212 and 213 form a low-voltage (LV) junction with the substrate 205 for the select transistor 210. The combination of high-voltage gate dielectric layer (i.e. an HV device) and a low-voltage junction enables the select transistor 210 to have both high voltage programming and smaller footprint.

In addition, the second select transistor 230 is formed with high-voltage device and low voltage (LV) junctions: the gate 235 and the gate dielectric 236 in the select transistor 230 support a high-voltage device, the doped regions 232 and 233 form a low-voltage (LV) junction with the substrate 205, and the doped regions 231 and 234 also form a low-voltage (LV) junction with the substrate 205. The breakdown threshold voltage for the low-voltage junction breakdown threshold voltage for an LV junction can be lower than 3.2V, or below 2.3V depending on technology node of the device. The LV junctions in the second select transistor 230 can reduce program-induced high voltage stress to the select transistors 210 and 230.

Furthermore, the second transistor 230 can be replaced with multiple transistors connecting in series to form a multiple-transistor one-capacitor (NT1C) memory cell.

The process of building the two-transistor one-capacitor (21T1C) antifuse OTP memory cell 200 is similar to the process flow chart for building a 1T1C antifuse OTP memory cell as shown in FIG. 1D.

In some embodiments, similar to the 2T1C antifuse OTP memory cell 200 described above, referring to FIG. 3, a three-transistor 2 capacitor (3T2C) memory cell 300 can include two 1T1C structures with the first 1T1C structure including a select transistor 310 and an antifuse capacitor 320, and the second 1T1C structure including a select transistor 330 and an antifuse capacitor 340. The two 1T1C structures provides the 3T2C memory cell 300 self-redundancy function. Additionally, the 3T2C memory cell 300 includes a third select transistor 350.

Figure 3:
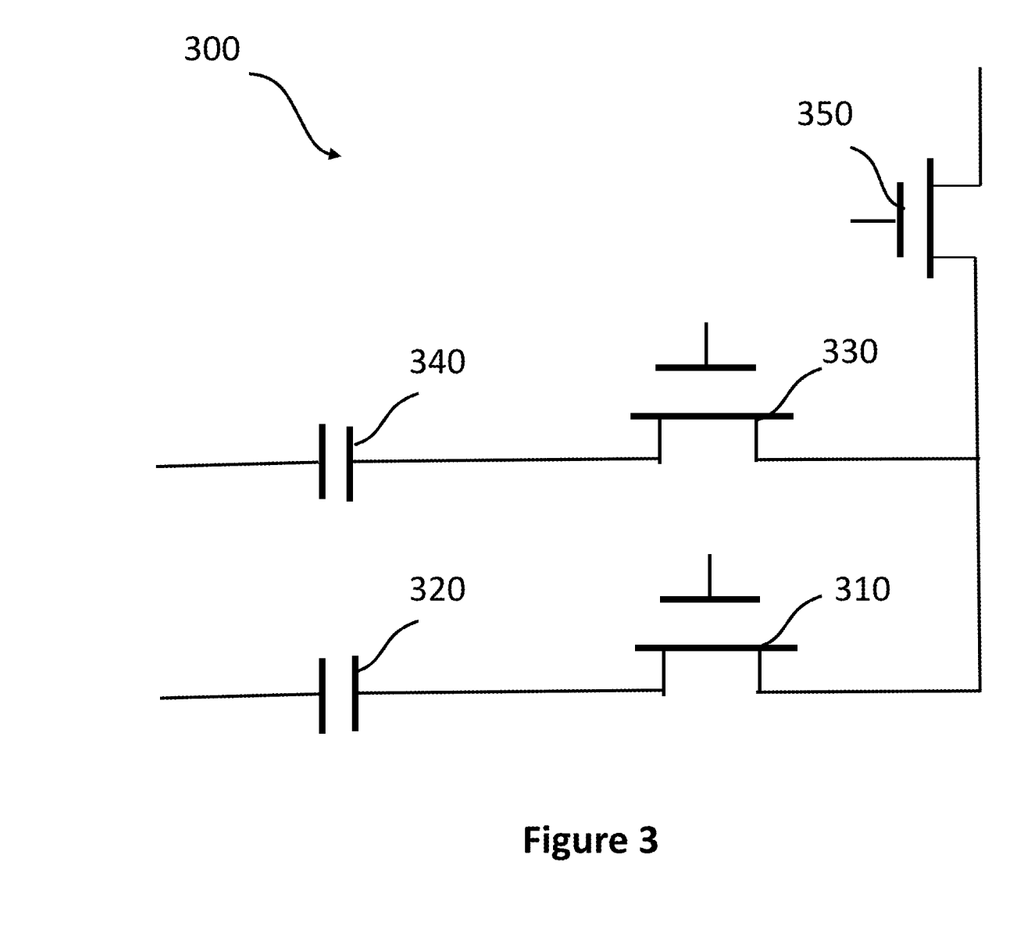
FIG. 3 an equivalent circuit diagram of three-transistor two-capacitor (3T2C) antifuse OTP memory cell in accordance with some embodiments of the present invention.

Similar to the 1T1C antifuse OTP memory cell 100 and the 2T1C antifuse OTP memory cell 200, the select transistors 310, 330 have their respective gate and gate dielectric layers forming high-voltage device, and their respective doped regions forming low-voltage (LV) junctions with the substrate. The combination of high voltage gate dielectric layer (i.e. an HV device) and a low voltage junction enables the select transistors 210 and 230 to have both high voltage programming and smaller footprint.

Specifically, the third select transistor 350 is formed by a HV device and LV junctions, which can reduce program-induced high voltage stress to the select transistor 310, 330.

In some embodiments, the 3T2C antifuse OTP memory cell 300 can be scaled to include multiple 1T1C structures, that is, a one-transistor with multiple one-transistor one-capacitor (1T with multiple 1T1C) in an antifuse OTP memory cell to provide additional redundancy. The additional select transistor has a high-voltage device and low voltage (LV) junctions to reduce program-induced high voltage stresses to the select transistors. Comparing with 2T1C memory cell 200, the 1T with multiple 1T1C antifuse OTP memory cell enables scaling of over-all memory array area.

The above description of the disclosed embodiments enables those skilled in the art to implement or use the present invention. Various modifications to these embodiments will be readily apparent to those skilled in the art, and the general principles defined herein may be applied to other embodiments without departing from the spirit or scope of the invention. Thus, the present invention will not be limited to the embodiments shown herein but will conform to the widest scope consistent with the principles and novel features disclosed herein.

What is claimed is:

1. An antifuse One-Time-Programmable memory cell, comprising:
   a substrate;
   one or more transistor-capacitor (1T1C) branches, each comprising:
      a first select transistor formed on the substrate, wherein the first select transistor includes:
         a first gate dielectric layer formed on the substrate,
         a first gate formed on the gate dielectric layer;
         a first low-voltage junction formed in the substrate; and
         a second low-voltage junction formed in the substrate,
      wherein a source and a drain for the first select transistor are formed by the first low-voltage junction and the second low-voltage junction; and
      an antifuse capacitor formed on the substrate, wherein the antifuse capacitor includes:
         a second gate dielectric layer formed on the substrate,
         a second gate formed on the gate dielectric layer;
         a third low-voltage junction formed in the substrate; and
         a fourth low-voltage junction formed in the substrate,
      wherein a source and a drain for the antifuse capacitor are respectively formed by the third low-voltage junction and the fourth low-voltage junction,
      wherein the second low-voltage junction and the third low-voltage junction are electrically connected; and
   a second select transistor formed on the substrate and in connection with the first select transistor, wherein the second select transistor includes:
      a third gate dielectric layer formed on the substrate,
      a third gate formed on the gate dielectric layer;
      a fifth low-voltage junction formed in the substrate; and
      a sixth low-voltage junction formed in the substrate,
   wherein a source and a drain for the second select transistor are formed by the fifth low-voltage junction and the sixth low-voltage junction,
   wherein the first low-voltage junction and the fifth low-voltage junction are electrically connected,
   wherein the third gate dielectric layer has a larger area than the first gate dielectric layer, which reduces high voltage stress in the first select transistor.

2. The antifuse One-Time-Programmable memory cell of claim 1, further comprising:
   two or more transistor-capacitor (1T1C) branches,
   wherein the second select transistor is in connection with the first select transistor in each of the two or more transistor-capacitor (1T1C) branches.

3. The antifuse One-Time-Programmable memory cell of claim 2, wherein the third gate dielectric layer has a larger area than the first gate dielectric layer in the first select transistor in each of the two or more transistor-capacitor (1T1C) branches, which reduces high voltage stress in the first select transistor in each of the two or more transistor-capacitor (1T1C) branches.

4. The antifuse One-Time-Programmable memory cell of claim 1, wherein the first low-voltage junction or the second low-voltage junction or the third low-voltage junction or the fourth low-voltage junction or the fifth low-voltage junction or the sixth low-voltage junction has a threshold junction breakdown voltage below 3.2 Volt.

5. The antifuse One-Time-Programmable memory cell of claim 4, wherein the first low-voltage junction or the second low-voltage junction or the third low-voltage junction or the fourth low-voltage junction or the fifth low-voltage junction or the sixth low-voltage junction has a threshold junction breakdown voltage below 2.3 Volt.

* * * * *